United States Patent [19]

Howard et al.

[11] Patent Number: 5,467,250

[45] Date of Patent: Nov. 14, 1995

[54] ELECTRICAL CABINET WITH DOOR-MOUNTED HEAT EXCHANGER

[75] Inventors: Paul A. Howard, Vienna; James H. Durham, Reston, both of Va.

[73] Assignee: Hubbell Incorporated, Orange, Conn.

[21] Appl. No.: 210,462

[22] Filed: Mar. 21, 1994

[51] Int. Cl.⁶ .................................................. H05K 7/20
[52] U.S. Cl. ......................... 361/696; 165/122; 361/701; 454/184
[58] Field of Search .......................... 454/184; 379/330, 379/437, 453; 174/16.1; 312/223.1; 165/80.3, 104.33, 122, 126; 361/796, 831, 690, 692, 694–696, 701, 724

[56] References Cited

U.S. PATENT DOCUMENTS

| | | | |
|---|---|---|---|
| 3,236,296 | 2/1966 | Dubin | 165/80 |
| 3,559,728 | 2/1971 | Lyman | 165/122 |
| 4,232,731 | 11/1980 | Kaplow et al. | 165/48 |
| 4,386,651 | 6/1983 | Reinhard | 165/104.33 |
| 4,447,856 | 5/1984 | Takahashi et al. | 361/383 |
| 4,449,579 | 5/1984 | Miyazaki et al. | 165/104.33 |
| 4,535,386 | 8/1985 | Frey, Jr. et al. | 361/389 |
| 4,722,026 | 1/1988 | Bennett et al. | 361/380 |
| 4,774,631 | 9/1988 | Okuyama et al. | 361/384 |
| 4,798,238 | 1/1989 | Ghiraldi | 165/32 |
| 4,837,663 | 6/1989 | Zushi et al. | 361/384 |
| 4,840,225 | 6/1989 | Foley et al. | 165/104.33 |
| 4,949,218 | 8/1990 | Blanchard et al. | 361/384 |
| 4,953,058 | 8/1990 | Harris | 361/383 |
| 5,040,095 | 8/1991 | Beaty et al. | 361/384 |
| 5,054,549 | 10/1991 | Ghaemian | 165/104.33 |
| 5,063,477 | 11/1991 | Paggen et al. | 361/384 |
| 5,101,320 | 3/1992 | Bhargava | 361/384 |
| 5,131,458 | 7/1992 | Bourne et al. | 165/49 |
| 5,138,522 | 8/1992 | Kojima et al. | 361/384 |
| 5,218,513 | 6/1993 | Brown | 361/384 |
| 5,243,131 | 9/1993 | Jakob et al. | 174/52.1 |
| 5,267,121 | 11/1993 | Uchida et al. | 361/694 |
| 5,297,000 | 3/1994 | Freige | 361/692 |

Primary Examiner—Gerald P. Tolin
Attorney, Agent, or Firm—Jerry M. Presson; John E. Holmes

[57] ABSTRACT

An electrical equipment cabinet utilizes a door-mounted, air-to-air heat exchanger for providing cooling to the equipment housed in the cabinet while maintaining a closed or sealed environment within the cabinet. An arrangement of ducts and vents is used to force interior and exterior air through the heat exchanger using powered fans mounted within the main portion of the cabinet. The mounting of the heat exchanger on or within the door of the cabinet makes more efficient use of the space available within the cabinet, and the placement of the fans within the main portion of the cabinet protects them from damage and avoids the need to provide electrical power to the door.

29 Claims, 9 Drawing Sheets

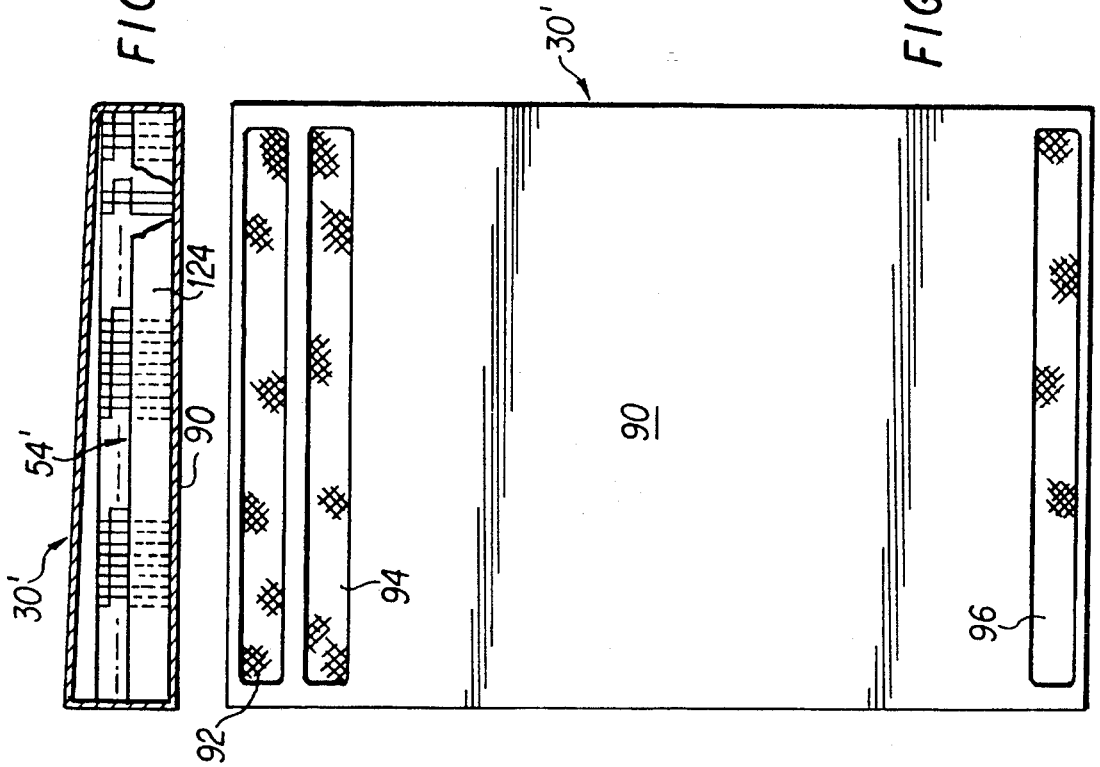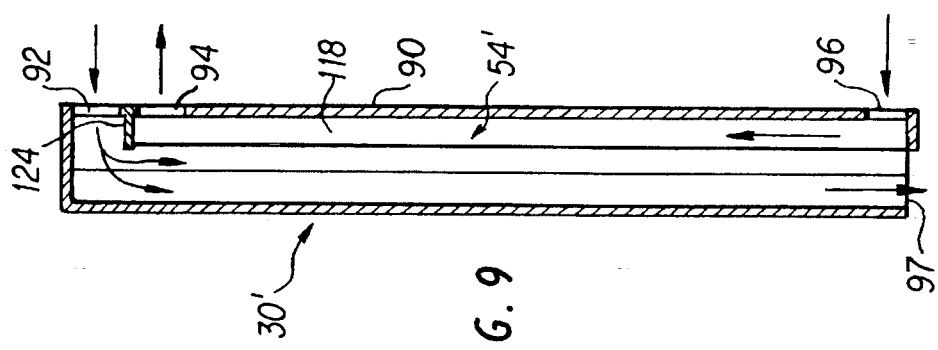

ELECTRICAL CABINET WITH DOOR-MOUNTED HEAT EXCHANGER

CROSS-REFERENCE TO RELATED APPLICATION

Related subject matter is disclosed and claimed in a copending application filed by Paul A. Howard and James H. Durham on Feb. 1, 1994, Ser. No. 08/189,756, entitled "Heat Exchanger for Electrical Cabinet or the Like", which is expressly incorporated herein by reference.

FIELD OF THE INVENTION

The present invention relates to an electrical equipment cabinet or the like, in which an air-to-air heat exchanger is used for cooling the equipment in the cabinet. More specifically, the invention relates to an electrical cabinet in which a door-mounted heat exchanger is employed, with one or more powered fans mounted in the main portion of the cabinet for maintaining an air flow through the heat exchanger.

BACKGROUND OF THE INVENTION

Outdoor electrical equipment cabinets are often used to protect sensitive electronic equipment from tampering, vandalism and adverse environmental conditions. Examples of the latter include high and low temperatures, rain and other forms of precipitation, and various types of particulates, such as dust, pollen and soot. One common use for outdoor cabinets is to house telephone equipment, such as the channel banks that are used to carry out analog-to-digital and digital-to-analog conversion between subscriber lines and telephone company lines. Advances in the state of the art have allowed channel banks and other types of telephone equipment to become smaller and to operate at higher power densities. In addition, some newer types of equipment (such as fiber optic equipment) are increasingly sensitive to dirt and other kinds of contamination. In order to address these needs, newer cabinet designs have had to dissipate heat more efficiently, and have also had to provide a greater degree of isolation from the outdoor environment.

An accepted practice in the manufacture of outdoor telephone equipment cabinets is to seal the cabinet from the outdoor environment in order to prevent contamination of the cabinet interior, and to dissipate internally generated heat using air-to-air heat exchangers. These devices exchange heat between the air in the cabinet and the ambient air outside the cabinet, without allowing the interior and ambient air to mix. In this way, a substantially closed or sealed environment can be maintained within the cabinet, while still allowing for adequate heat dissipation. Typically, the heat exchanger is located in the main portion of the cabinet, in proximity to the electronics requiring cooling. However, the presence of the heat exchanger in the cabinet can interfere with the cables used to interconnect the various electronic components, making the routing of these cables somewhat more difficult. Also, since the heat exchanger occupies a significant amount of space, the cabinet must usually be made larger to accommodate it. Thus, for example, if the heat exchanger is located near the roof of the cabinet, as is sometimes the case, the height of the cabinet must usually be increased. Similarly, if the heat exchanger is located at the side or end of the cabinet, the length or width of the cabinet must usually be increased. Unfortunately, any increase in the size of the cabinet is undesirable, since these cabinets are often placed in residential areas and must be as small and as low in height as possible to avoid aesthetic objections.

There has been at least one attempt to mount a heat exchanger onto the door of an electrical equipment cabinet, an arrangement which, at least in theory, makes more efficient use of the space available within the cabinet. In U.S. Pat. No. 4,535,386, to Frey, Jr. et al, a heat exchanger in the form of a corrugated sheet is secured to the inner surface of the door of a sealed enclosure containing heat-generating electronic devices. The corrugations form passageways through which ambient air rises on the outside of the enclosure, thereby cooling the side of the heat exchanger facing the interior of the enclosure. This causes the air inside the enclosure to be cooled and to sink downwardly along the interior surface of the corrugated sheet, thereby creating natural air turbulence within the enclosure.

Although the heat exchanger of U.S. Pat. No. 4,535,386 is relatively simple and compact in construction, the reliance on purely convective air flows inherently limits its cooling capacity. In cases where the equipment within the cabinet is tightly packed and has a high power density, or in cases where the configuration of the cabinet is such that the area of the door is relatively small relative to the volume of the cabinet, these convective air flows may not provide adequate cooling. The addition of fans to force air through the heat exchanger would present additional difficulties, since the mounting of fans on the door would require that electrical power be supplied to the door through a flexible cable or the like. This would increase the complexity of the door structure considerably, and would also render the door more susceptible to damage or failure due to external impacts, shocks from repeated opening and closing, and other factors.

SUMMARY OF THE INVENTION

The primary object of the present invention is to provide an electrical equipment cabinet in which a door-mounted, air-to-air heat exchanger is used to provide efficient cooling for the electrical equipment inside the cabinet, without occupying space needed for the electrical equipment or for interconnecting cables, and without significantly increasing the overall dimensions of the cabinet.

A further object of the invention is to provide an electrical equipment cabinet in which a door-mounted, air-to-air heat exchanger is used in combination with one or more powered fans mounted in the main portion of the cabinet, the latter serving to maintain a flow of interior and/or exterior air through the heat exchanger so that it can operate at maximum efficiency.

A further object of the invention is to provide an electrical equipment cabinet in which a flow of interior and/or exterior air can be maintained through a door-mounted, air-to-air heat exchanger without requiring that fans or electrical power be present on the door structure itself.

Still other objects of the invention are to provide an outdoor electrical equipment cabinet with a door-mounted, air-to-air heat exchanger which increases the strength and integrity of the door structure, provides the door with improved impact and crush resistance, affords greater protection for the electronic equipment inside the cabinet, reduces solar loading on the cabinet, is easily accessible for cleaning or maintenance, operates cleanly and with minimum fan noise, and can be used in cold climates to retain heat within the cabinet when the fans are not operating.

The foregoing objects are substantially achieved by providing an electrical equipment cabinet comprising an enclosure adapted to contain heat-generating electrical equipment and having at least one access opening, a door received in the access opening for permitting access to the electrical equipment when open and for maintaining a substantially closed environment in the cabinet when closed, and an air-to-air heat exchanger carried by the door for removing heat from the cabinet while maintaining a substantially closed environment within the cabinet. The heat exchanger defines a first air flow path for air from the exterior of the cabinet and a second air flow path for air from the interior of the cabinet, with the first and second air flows being substantially isolated from each other. A powered fan is mounted in the enclosure for circulating air through at least one of the first and second air flow paths of the heat exchanger, in order to provide cooling for the interior of the cabinet.

In accordance with a further aspect of the present invention, an electrical equipment cabinet comprises an enclosure adapted to contain heat-generating electrical equipment and having at least one access opening, a door received in the access opening for permitting access to the electrical equipment when open and for maintaining a substantially closed environment in the cabinet when closed, and an air-to-air heat exchanger carried by the door for removing heat from the cabinet while maintaining a substantially closed environment within the cabinet. The heat exchanger defines a first air flow path for air from the exterior of the cabinet and a second air flow path for air from the interior of the cabinet, with the first and second air flow paths being substantially isolated from each other. A first powered fan is mounted in the enclosure for circulating air through the first air flow path, and a second powered fan is mounted in the enclosure for circulating air through the second air flow path.

In accordance with a still further aspect of the present invention, a method for using an air-to-air heat exchanger to provide cooling to the interior of an electrical equipment cabinet having an enclosure portion and a door comprises the step of mounting the heat exchanger to the door of the electrical equipment cabinet, maintaining a first flow of air from the exterior of the cabinet through a first flow path in the heat exchanger, and maintaining a second flow of air from the interior of the cabinet through a second flow path in the heat exchanger, with the first and second air flow paths being substantially isolated from each other, and with at least one of the first and second air flows being maintained by powered air flow means mounted in the enclosure portion of the cabinet.

Other objects, advantages an novel features of the present invention will become apparent from the following detailed description which, when taken in conjunction with the annexed drawings, discloses preferred embodiments of the invention.

BRIEF DESCRIPTION OF THE DRAWINGS

Referring now to the drawings, which form a part of the original disclosure:

FIGS. 7, 8 and 9 are elevational, top sectional and side sectional views, respectively, of a modified door construction incorporating a different type of air-to-air heat exchanger;

DETAILED DESCRIPTION OF THE PREFERRED EMBODIMENTS

Figure 1:
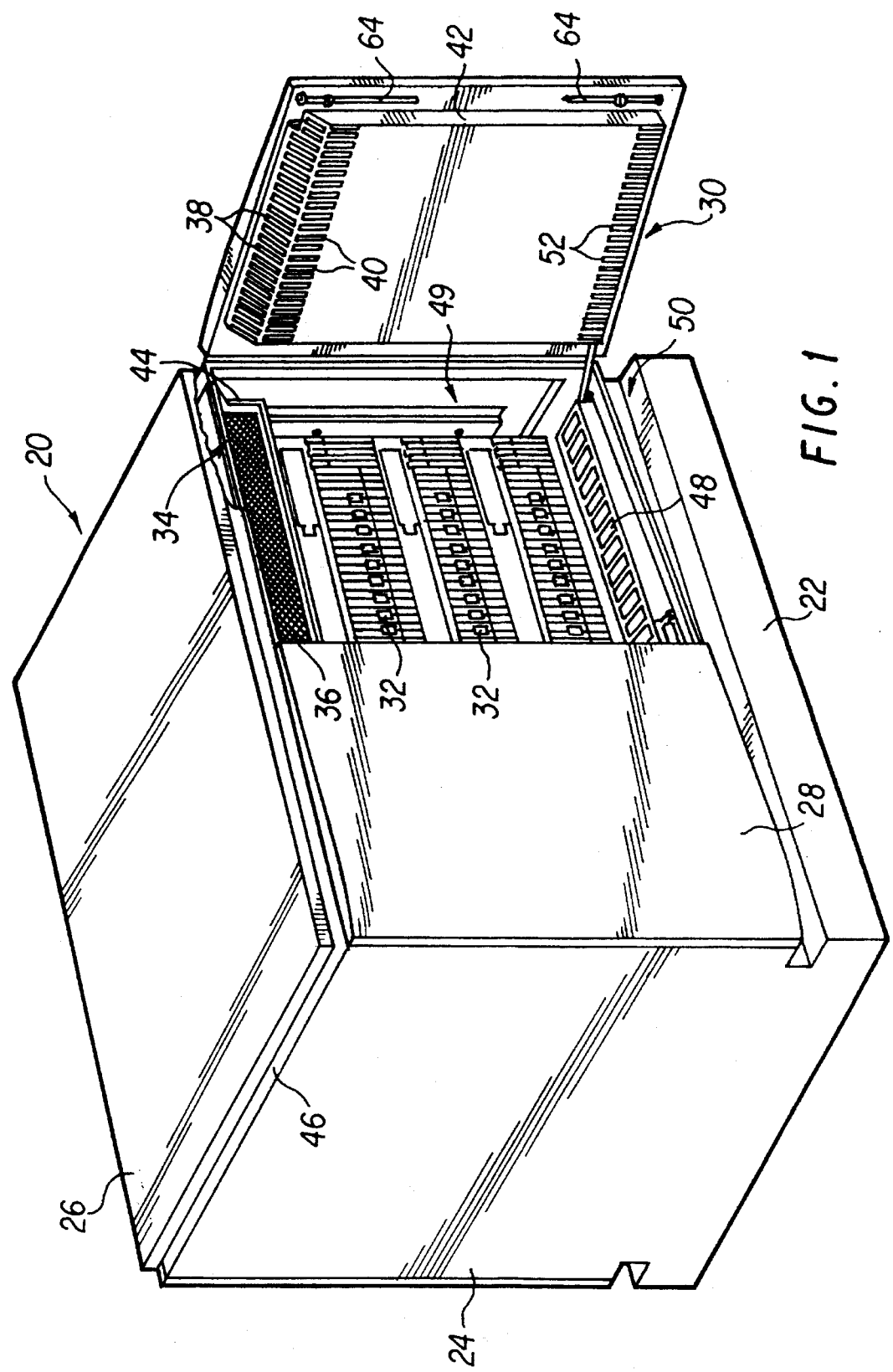
FIG. 1 is a perspective view of an outdoor telephone cabinet incorporating a door-mounted, air-to-air heat exchanger in accordance with the present invention.
Figure 2:
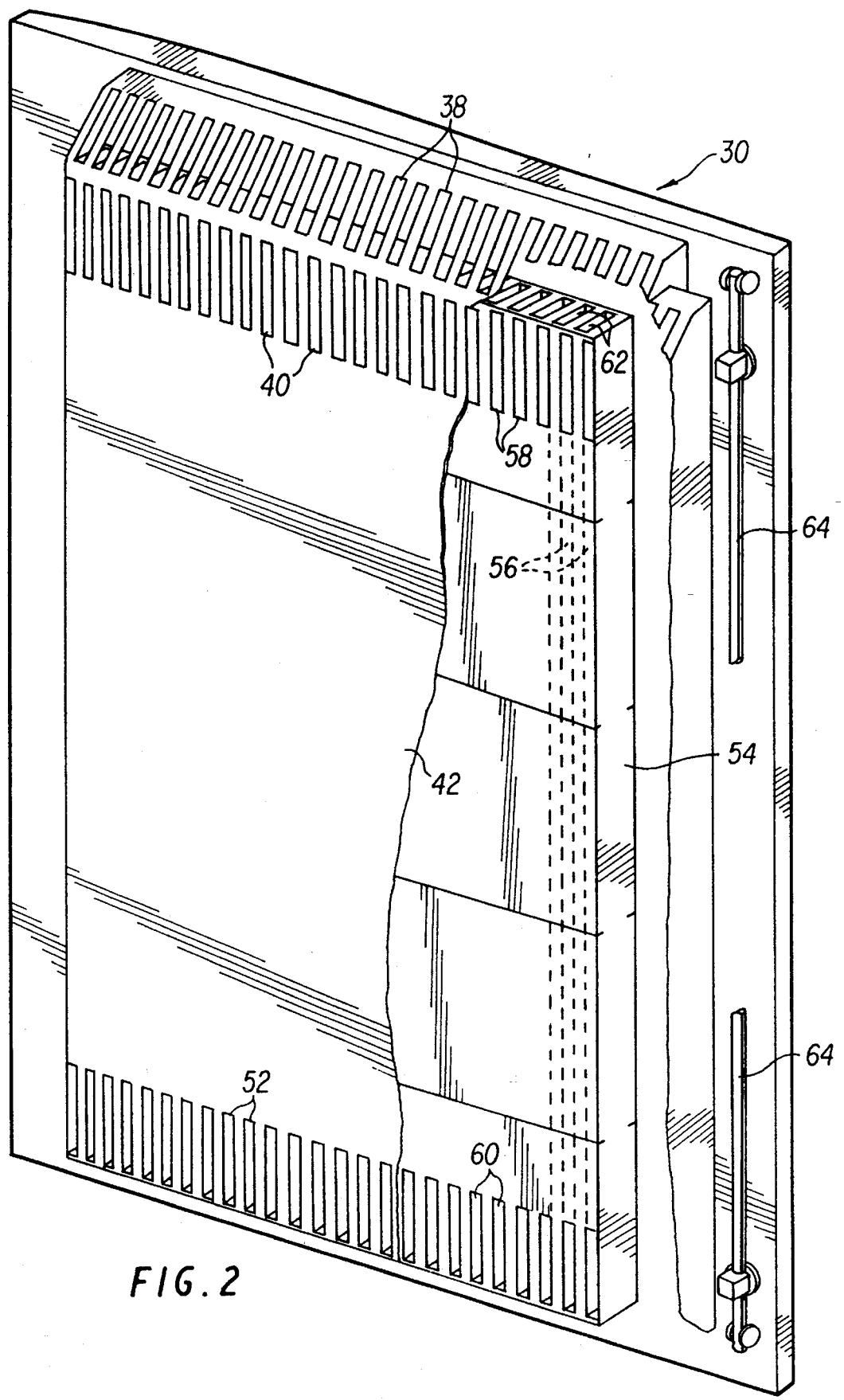
FIG. 2 is a perspective view of one of the four doors of the outdoor telephone cabinet, shown partially cut away to illustrate the details of an air-to-air heat exchanger mounted within the door.
Figure 3:
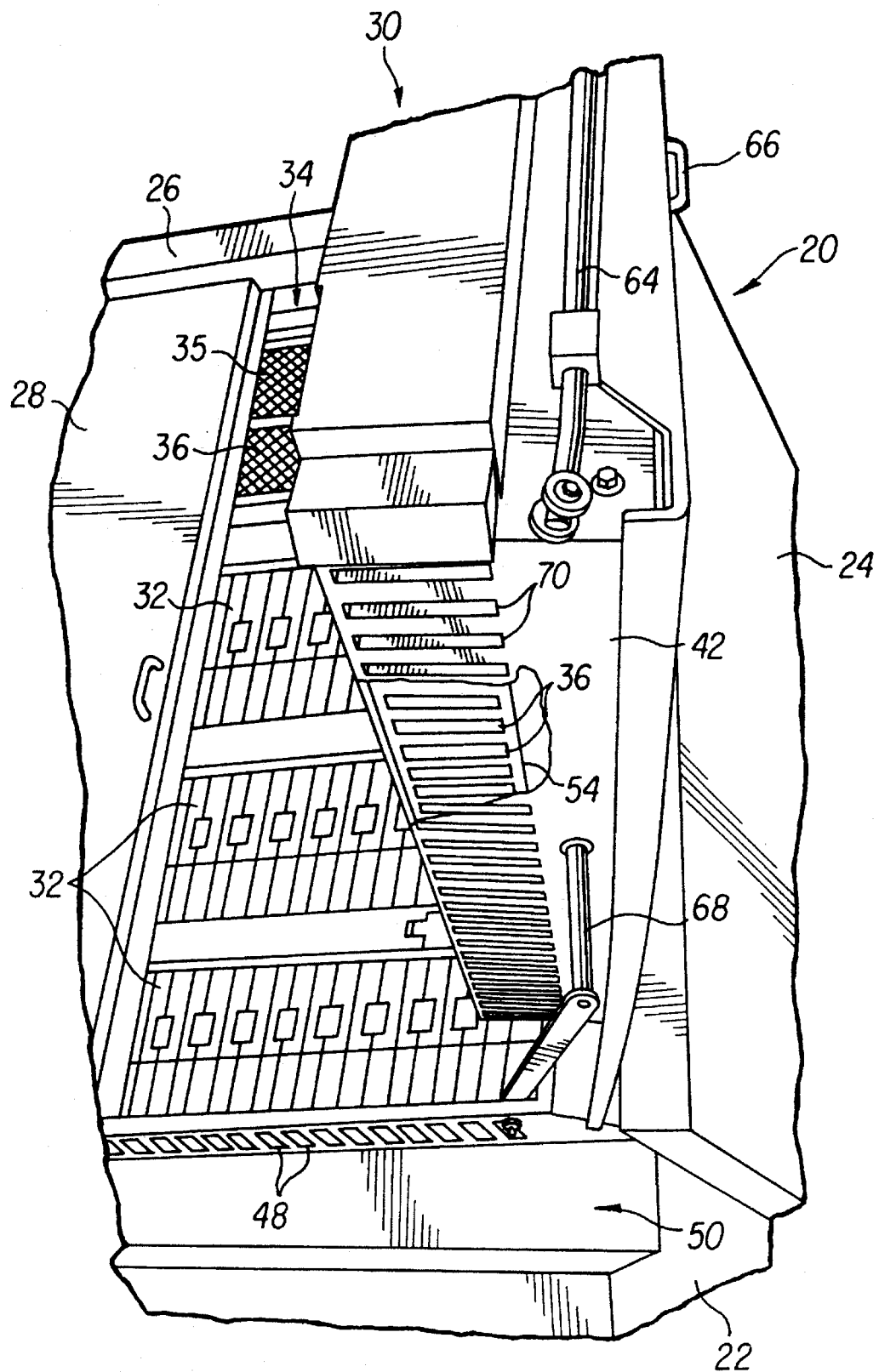
FIG. 3 is a partially cut away perspective view of the bottom of the door, illustrating the lower portion of the heat exchanger and the vents in the lower surface of the door through which outside air is exhausted from the heat exchanger.
Figure 4:
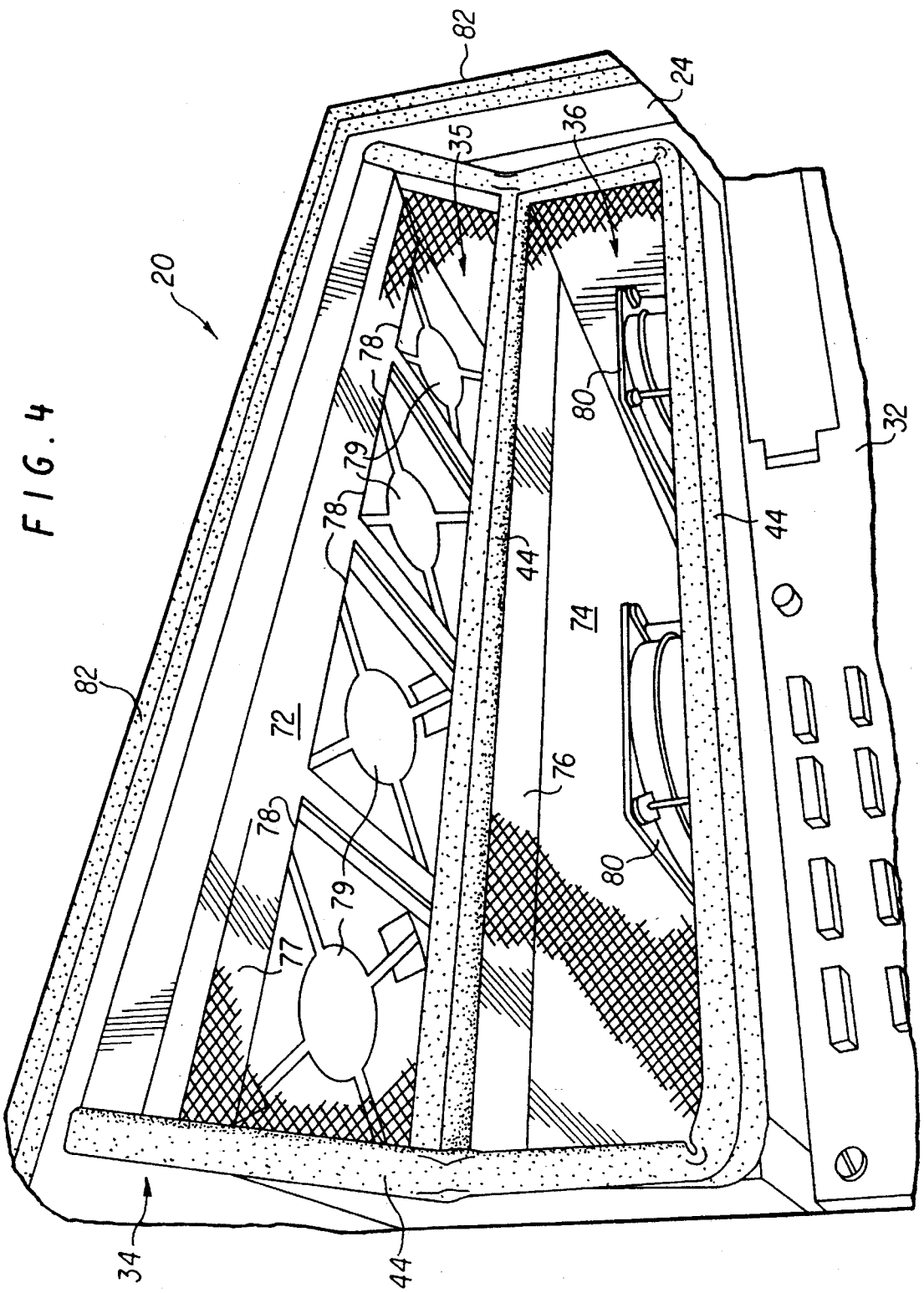
FIG. 4 is a perspective view of the forward portion of a removable fan shelf installed in the electrical equipment cabinet, with the mesh screens partially removed to illustrate internal fans and ducts which circulate air through the door-mounted heat exchanger.

FIG. 1 illustrates an outdoor telephone cabinet 20 incorporating a door-mounted, air-to-air heat exchanger in accordance with the present invention. The cabinet 20 has a generally upright rectangular shape, with a base 22, side walls 24, a roof 26, and a pair of doors 28 and 30 located at the front of the cabinet. An identical pair of doors (not shown) is provided at the rear of the cabinet 20. The right-hand door 30 at the front of the cabinet 20 is shown in the open position in FIG. 1 to illustrate the interior of the cabinet. The cabinet 20 contains a number of equipment racks or channel banks 32, which are stacked in four vertical columns (two in the front of the cabinet and two in the rear) on shelves provided in the cabinet. Above each column of equipment racks 32 is a removable fan shelf 34 having two rectangular duct openings 35 and 36, one located above the other. The lower duct opening 36, which is covered by a mesh screen, is visible in FIG. 1. The upper duct opening 35, visible in FIGS. 3 and 4, is located immediately above the lower duct opening 36. The plane of the upper duct opening 35, also covered by a mesh screen, is inclined at an angle with respect to the plane of the lower duct opening 36 as shown in FIG. 4. The angles formed by the planes of the upper and lower duct openings 35 and 36 match the angles of two rows of vents 38 and 40, respectively, which are formed in the upper portion of a housing 42 affixed to the inside surface of the door 30 as shown in FIGS. 1 and 2. The housing 42 contains an air-to-air heat exchanger, which will be described in detail shortly, for exchanging heat between the interior and exterior of the cabinet 20 in cooperation with the fan shelf 34.

When the door 30 is in the closed position, the upper duct opening 35 of the fan shelf 34 is aligned with the upper row of vents 38 in the housing 42, and the lower duct opening 36 is aligned with the second row of vents 40. A resilient gasket 44 (more clearly visible in FIG. 4) surrounds lower duct opening 35 and the lower three sides of the upper duct opening 36, and bears against the perimeter of each row of vents 38 and 40 when the door 30 is in the closed position. This establishes separate and mutually isolated air flow paths between the upper and lower duct openings 35 and 36 of the fan shelf 34 and the respective rows of vents 38 and 40. A number of fans, to be described in more detail shortly, are mounted in and above the fan shelf 34 in order to maintain air flows through the duct openings 35 and 36 and vents 38 and 40. Referring to FIG. 1, fans mounted to the ceiling of the cabinet 20 above the top duct opening 35 draw outside or ambient air in through a slot or vent 46 located immediately beneath the roof 26 of the cabinet 20, and this air is forced downwardly into the door-mounted heat exchanger through the top row of vents 38 in the housing 42. The air emerges from the heat exchanger through a further set of vents (not shown) located on the lower surface of the housing 42, and these vents align with a corresponding set of vents 48 which are formed in the lower interior wall of the cabinet 20 near the edge of the access opening 49 which receives the door 30. The vents 48 communicate directly with the exterior of the cabinet 20 through a recessed area 50 located between the base 22 and the lower edges of the doors 28 and 30. The vents 38 and the corresponding vents on the lower surface of the housing 42 align with a first set of channels through the heat exchanger which together form a first flow path for air drawn from the outside of the cabinet 20. The vents 40, on the other hand, align with a second set of channels in the heat exchanger which are staggered or interdigitated with respect to the first set of channels, and which together constitute a second flow path for air drawn from the interior of the cabinet 20. The vents 40 communicate via the second set of channels with a further set of vents 52 located along the bottom vertical surface of the housing 42, with the positions of the vents 52 corresponding to the openings of the second set of channels at the bottom of the heat exchanger. The fans in the lower duct of the fan shelf 34 operate in the opposite direction with respect to those in the upper duct, and cause air to be drawn into the duct opening 36 from the vents 40. This, in turn, causes air to be drawn into the lower vents 52 from the interior of the cabinet 20, and hence through the second set of channels in the heat exchanger contained within the housing 42. The air drawn into the lower duct opening 36 from the vents 40 is blown downwardly by the fans through the equipment racks 32, in order to provide cooling for the electrical equipment in these racks.

From the foregoing description, it will be appreciated that a continuous flow of interior air is maintained through the equipment racks 32, lower duct opening 36, and vents 40 and 52 of the heat exchanger housing 42. At the same time, a separate flow of outside air is drawn in through the slot 46 of the cabinet 20, forced through the upper row of vents 38 in the heat exchanger housing 42 by means of the fans located above the upper duct of the fan shelf 34, passes through the heat exchanger in the housing 42, and then passes out of the cabinet through the vents in the bottom of the housing 42 and the corresponding vents 48 at the bottom of the cabinet. Since the inside and outside air flows are isolated from each other and do not mix, the environment within the cabinet 20 remains sealed while heat is removed from the interior of the cabinet by means of the heat exchanger.

FIG. 2 is a detailed perspective view of the door 30, with a portion of the housing 42 cut away to illustrate the construction of the heat exchanger 54 within the housing. The heat exchanger 54 is an upright rectangular structure, preferably made of sheet metal (such as 0.040-inch thick aluminum alloy), with a series of narrow vertical channels 56 having rectangular cross-sections. Two channel outlet configurations are provided, and these configurations alternate along the width of the heat exchanger 54. In one configuration, the channels have narrow rectangular openings 58 and 60 which are oriented vertically and are directly in register with the vents 40 and 52 of the housing 42. In the second configuration, the channels 56 terminate in narrow rectangular openings which are oriented horizontally at the top and bottom of the heat exchanger 54. The top openings 62 are visible in FIG. 2, the bottom openings 63 occupy corresponding positions along the lower surface of the heat exchanger 54 as illustrated in FIG. 3. The top openings 62 communicate with a plenum chamber behind the vents 38, and are not directly in register with the vents 38. It will be appreciated that, due to the registration between the vents 40 and channel openings 58 at the top of the heat exchanger, and the registration between the vents 52 and channel openings 60 at the bottom of the heat exchanger 54, the interior air flowing through the heat exchanger remains separated from the flow of exterior or ambient air. At the same time, however, the staggered or interdigitated nature of the channels 56 provides a large heat exchange surface between the interior and exterior air flows, allowing the heat exchanger 54 to efficiently transfer heat from the interior air to the exterior or ambient air.

Although only the right-hand door 30 of the cabinet 20 is illustrated in FIG. 2, it will be understood that the construction of the left-hand door 28 of FIG. 1 is essentially identical. Furthermore, the two rear doors of the cabinet 20, which are not visible in FIG. 1, will be understood to have the same construction as the front doors 28 and 30. The front and rear doors can be opened and closed in order to gain access to the various equipment racks within the cabinet 20, and are maintained in the closed position by means of a three-point latching device 64 (only the top and bottom portions of which are shown in FIGS. 1 and 2) carried by the right-hand door of each pair. When all four doors are in the closed position, a closed or sealed environment is maintained within the cabinet 20 and heat generated by the electrical equipment is dissipated by means of the four door-mounted air-to-air heat exchangers.

FIG. 3 is a bottom perspective view of the door 30, shown in the open position as in FIG. 1. The door 30 is pivotally mounted to the frame of the cabinet 20 by means of hinges (not shown) located along its right-hand edge. A handle 66 on the outside of the door operates the three-point latching device 64, the lower portion of which engages the frame of the cabinet 20 to maintain the door 30 in the closed position. When the door 30 is in the open position as shown, a linkage 68 at the bottom of the door prevents it from closing inadvertently. Visible in FIG. 3 are the lower vents 70 in the housing 42, which align with the corresponding openings 63 on the lower surface of the heat exchanger 54 as described previously in connection with FIG. 2. When the door 30 is in the closed position, outside or ambient air is exhausted through the vents 70 after it passes through the heat exchanger 54, and this air passes directly to the exterior of the cabinet 20 through the lower vents 48. Suitable gaskets are provided around the vents 48 in order to ensure that the ambient air exhausted from the heat exchanger 54 does not mix with the air in the interior of the cabinet 20.

In a modified embodiment of the cabinet 20 (not shown), the lower edge portion of the cabinet in which the vents 48 are formed can be deleted entirely so that the ambient air emerging from the vents 70 of the heat exchanger housing 42 passes directly to the outside of the cabinet. The lower edge of the cabinet opening 49 may then be provided with a gasket or seal which abuts the lower edge of the heat exchanger housing 42, just below the vents 52, in order to seal the cabinet 20 when the door 30 is in the closed position. This modified construction is somewhat simpler and less expensive than the embodiment shown, but its operation is essentially the same.

FIG. 4 is a perspective view of the fan shelf 34 of FIG. 1, with the mesh partially removed from the upper and lower duct openings 35 and 36 to illustrate the internal construction of the fan shelf. As will be apparent, the fan shelf 34 comprises upper and lower rectangular ducts 72 and 74, respectively, which are divided from each other by means of an intermediate horizontal partition 76. In the ceiling 77 of the upper duct 72 are four rectangular apertures 78 which align with corresponding apertures formed in the ceiling of the cabinet 20. Four electrically powered fans 79 are installed above the apertures in the cabinet ceiling and are arranged to force outside or ambient air in the downward direction into the duct 72 from a plenum area of the cabinet 20 (not shown in FIG. 4) located above the fan shelf 34. The fans 79 are preferably arranged in a straight row parallel to the front of the cabinet 20, as shown. The air from the duct 72 is forced through the vents 38 and 70 of the heat exchanger housing 42, and hence through the corresponding vents 62, 63 and vertical channels 56 of the heat exchanger 54, as described previously with reference to FIGS. 1–3. A second group of fans 80, two of which are visible in FIG. 4, are installed in the base or floor of the lower duct 74 of the fan shelf 34. The purpose of the fans 80 is to force interior air downwardly through the racks 32 of electrical equipment in the cabinet 20, with this air being drawn into the duct 74 through the lower duct opening 36. Since the lower duct opening 36 is in register with the vents 40 of the heat exchanger housing 42 when the door 30 is in the closed position, it will be evident that the air drawn into the duct 74 by the fans 80 is interior air that has passed through the openings 58, 60 and corresponding channels 56 of the heat exchanger 54, and through the vents 52 and 40 of the heat exchanger housing 42. This air is isolated from the air in the upper duct 72 when the door 30 is in the closed position, in order to maintain the desired closed or sealed environment within the interior cabinet 20. As noted previously, this isolation is achieved by means of the resilient gasket 44 when the door 30 is in the closed position. (A gasket is not necessary for the lower row of vents 52 in FIGS. 1 and 2, since these vents communicate directly with the interior of the cabinet 20.) A further gasket 82, a portion of which is visible in FIG. 4, is provided around the perimeter of the cabinet opening 49 which receives the door 30, and forms a seal with the interior surface of the door 30 to isolate the interior of the cabinet 20 from the exterior or ambient air.

As noted above, only two of the four fans 80 in the lower duct 74 are shown in FIG. 4. The other two fans are located in staggered positions behind and to the left of the two fans shown. In this arrangement, the four fans 80 maintain a uniform flow of air across the width and depth of the equipment rack 32. In the preferred embodiment, the entire fan shelf 34 (including the fans 80 and the various partitions forming the ducts 72 and 74) is removable as a unit from the cabinet 20 to facilitate repair and replacement. In its installed position, the fan shelf 34 is attached by means of screws (not shown) to the interior frame of the cabinet 20, in much the same manner as one of the equipment racks 32 is installed. It should be understood that a total of four fan shelves 34 are provided in the cabinet 20 of FIG. 1, one pair for each of the two columns of equipment racks 32 at the front and rear of the cabinet. The number of fan shelves 34 may, of course, be changed in accordance with the size and configuration of the particular cabinet in which they are used.

Figure 5:
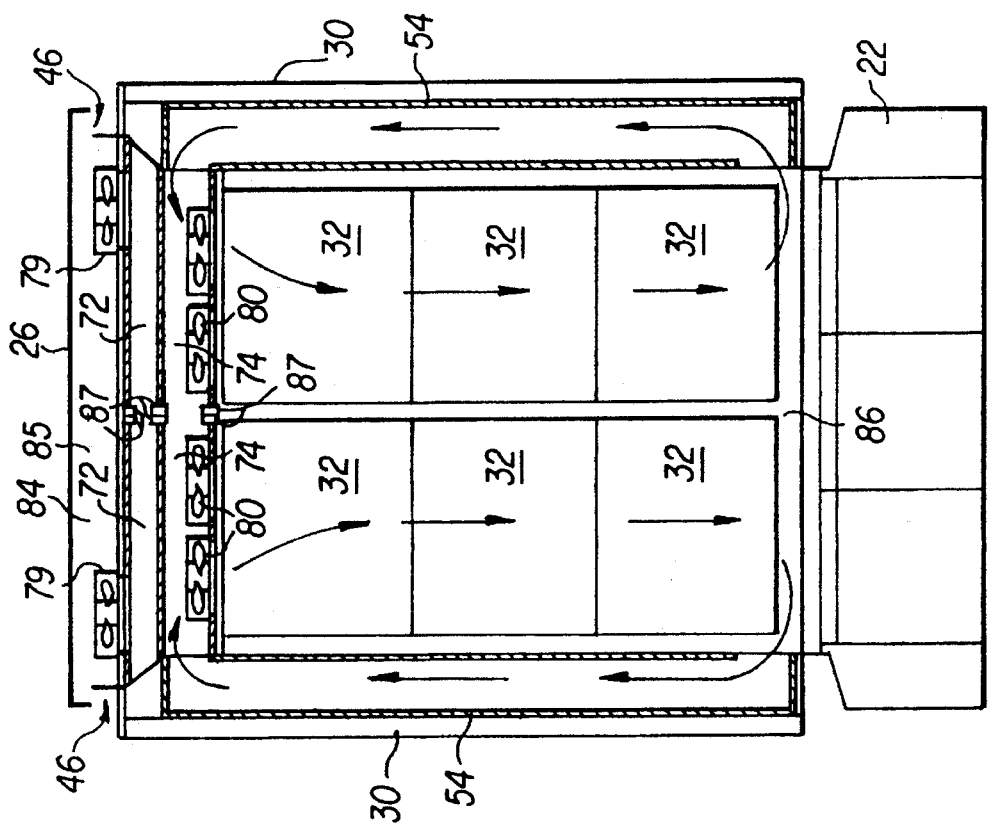
FIGS. 5 an 6 are schematic views of the outside and inside air flow patterns, respectively, through the door-mounted heat exchanger.
Figure 6:
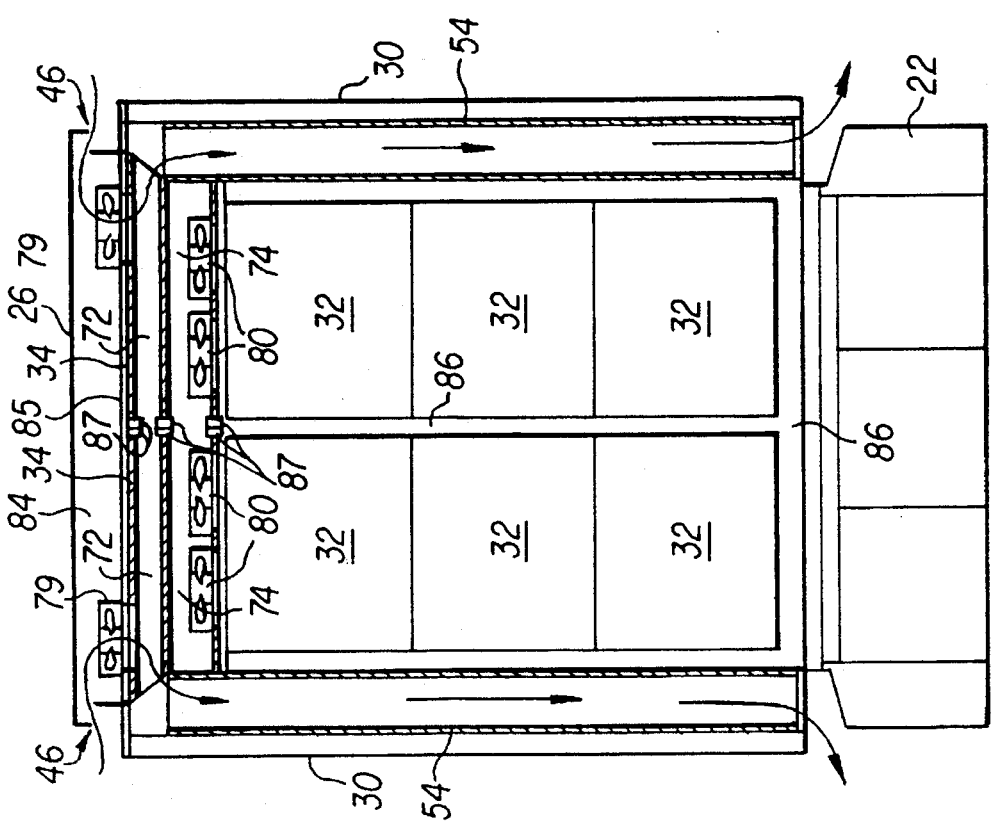

FIGS. 5 and 6 are schematic views illustrating the flows of exterior and interior air, respectively, through the cabinet 20. In FIG. 5, exterior or ambient air enters the cabinet 20 through the vents 46 and is drawn into a plenum chamber 84 located above the fan shelves 34. The fans 79 mounted to the ceiling 85 of the cabinet 20 force the outside air from the plenum chamber 84 into the upper duct 72 of each fan shelf 34, through the vents 38 at the top of the heat exchanger housing 42, through the first set of channels 56 in the heat exchanger 54, and back to the outside of the cabinet 20 through the bottom vents 70 and 48 of FIG. 3. Thus, a continuous flow of outside or ambient air is maintained between the inlet vents 46 and the outlet vents 48 by the fans 79, for the purpose of removing heat from the heat exchangers 54. In FIG. 6, the flow of interior air through the second set of channels 56 of the heat exchangers 54 is illustrated. The fans 80 draw air into the lower duct 74 of each fan shelf 34 from the vents 40 at the top of the heat exchanger housing 42, and this air is forced downwardly through the electrical equipment racks 32 to provide cooling for the equipment in these racks. At the bottom of the cabinet interior 86, the interior air is drawn into the heat exchangers 54 through the vents 52 at the bottom of each heat exchanger housing 42. The air is then drawn upwardly through the second set of heat exchanger channels 56, and emerges from the vents 40 at the top of each heat exchanger housing 42. The air then returns to the lower ducts 74 of the fan shelves 34. Thus, a continuous circulation of interior air is maintained through the equipment racks 32 and heat exchangers 54 by the fans 80, and this air does not mix with the flow of exterior air maintained by the fans 79.

As illustrated in FIGS. 5 and 6, the upper and lower ducts 72 and 74 of each fan shelf are each open at the rear, and these rear openings are provided with resilient circumferential gaskets 87. When two oppositely facing fan shelves 34 are installed in the front and rear of the cabinet 20 as shown, the gaskets 87 of the two fan shelves are brought into abutting contact with each other to connect and seal the respective pairs of ducts 72 and 74. In this way, the upper ducts 72 of the abutting fan shelves 34 form a common plenum chamber for outside air, and the lower ducts 74 of the abutting fan shelves form a similar plenum chamber for interior air, with these two plenum chambers being isolated from each other by the gaskets 87 to prevent mixing between the outside and interior air flows. Since the plenum chamber defined by the two upper ducts 72 of the abutting fan shelves 34 is on the outlet (high pressure) side of the fans 79, a flow of outside air will be maintained through both ducts even if some or all of the fans 79 on one side or the other become inoperative. If desired, the same advantage can be realized for the interior air flow by changing the configuration of the lower ducts 74 so that the plenum chamber formed by these ducts is on the outlet side of the fans 80. In addition to allowing for redundancy in the event of inoperative fans, the use of these plenums is advantageous in that a few larger fans can, if desired, be substituted for the smaller and more numerous fans 79 and 80.

FIGS. 7–9 disclose a modified door 30' and heat exchanger 54' which may be used in connection with the present invention. In the modified door construction, the interior surface 90 of the door 30' is substantially planar from top to bottom, without the projecting housing 42 or the bevelled or inclined area that carries the row of vents 38 in FIG. 1. The rows of vents 38, 40, 52 and 70 in FIGS. 1–3 are replaced by four elongated rectangular openings 92, 94, 96 97 at approximately the same positions, and these openings are covered by mesh screens as shown. Since the upper two openings 92 and 94 are coplanar, the corresponding duct openings 35 and 36 of the fan shelf 34 in FIG. 4 are also made coplanar. This simplifies the manufacture of the cabinet 20, since the engineering tolerances required to properly align the mutually inclined duct openings 35 and 36 of FIG. 4 with the corresponding rows of vents 38 and 40 of FIG. 1 when the door 30 moves to the closed position are more exacting than those required to align coplanar vents and duct openings.

Figure 10:
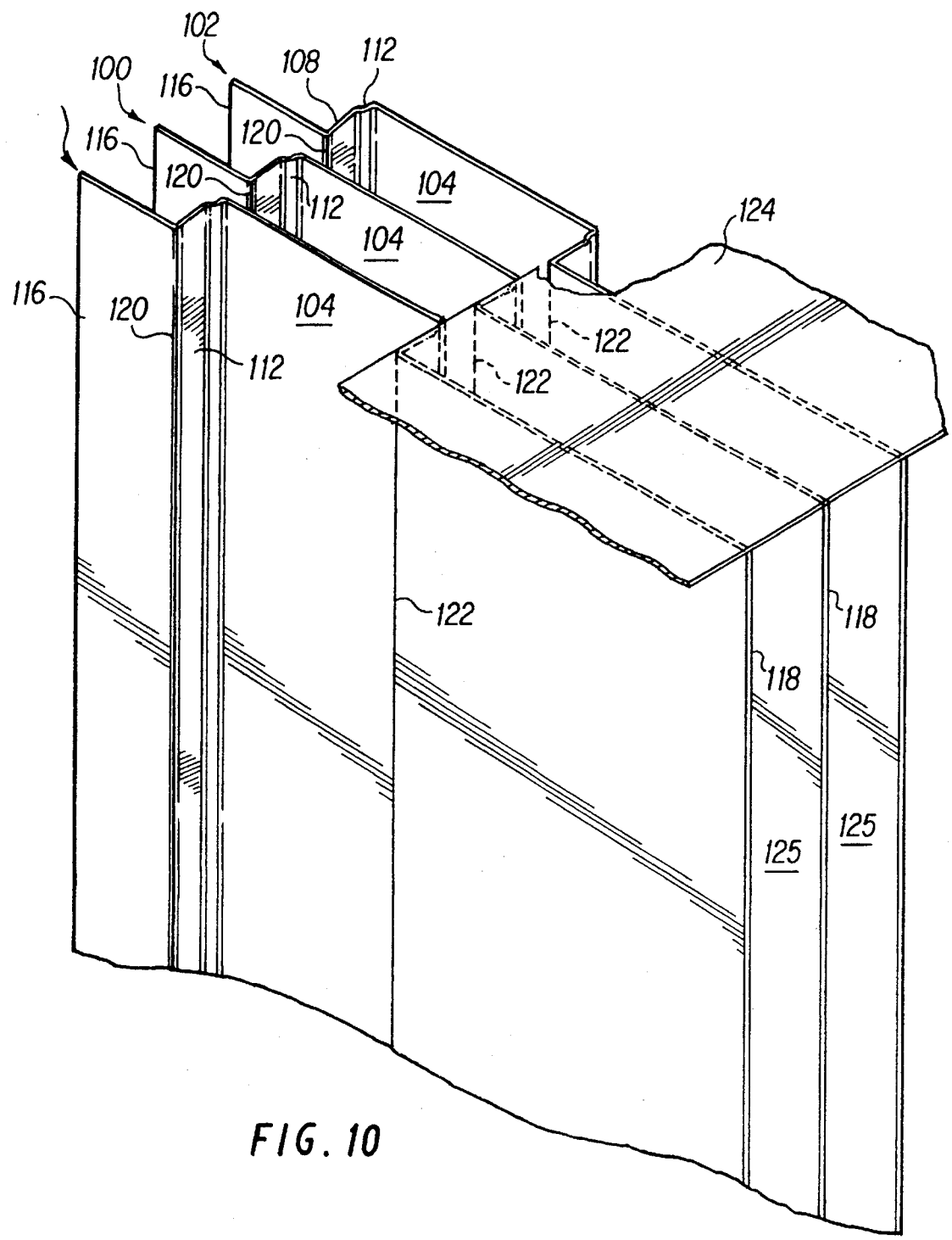
FIG. 10 is an exploded perspective view of the heat exchanger used in the embodiment of FIGS. 7, 8 and 9.

The heat exchanger 54' of FIGS. 7–9 is also simpler in construction than the heat exchanger 54 of FIGS. 1–6. In FIGS. 7–9, the heat exchanger 54' is made up of a number of connected sections or modules which are substantially identical to each other, allowing a heat exchanger of virtually any size and capacity to be assembled simply by increasing or decreasing the number of sections or modules. The configuration of the individual sections or modules is illustrated in FIG. 10, in which the sections 98, 100 and 102 are shown slightly separated from each other for clarity. Each section comprises a rectangular channel 104 which is defined by a longitudinal side wall 106 and by two shorter longitudinal side walls 108 and 110 joined to the laterally opposed edges of the longitudinal side wall 106. Longitudinal grooves or notches 112 and 114 are formed along the edges joining the longitudinal side wall 106 with the shorter longitudinal side walls 108 and 110, as shown. The side walls 108 and 110 taper slightly inward (i.e., toward each other) in the direction away from the longitudinal side wall 106, and terminate in outwardly extending fins 116 and 118. The longitudinal side walls 108 and 110 are joined to the fins 116 and 118 along longitudinally extending edges or corners 120 and 122. In order to assemble the heat exchanger 54', the sections 98, 100 and 102 are joined together by snapping the edges or corners 120 and 122 into the corresponding notches 112 and 114. A baffle plate or partition 124 is placed horizontally across the top edges of the fins 118 and is held in place by welding, brazing or any other suitable method. The assembled heat exchanger 54' then defines two mutually isolated air flow paths, one comprising the vertical parallel channels 104 (and, if desired, the vertical gaps between the fins 116), and the other comprising the vertical gaps 125 between the fins 118.

The heat exchanger 54' of FIG. 10 is installed in the door 30' of FIGS. 7–9 with the fins 118 located adjacent to the inner surface 90 of the door 30', and with the partition 124 located at an intermediate position between the openings 92 and 94. In this way, the air drawn from the interior of the telephone cabinet 20 circulates through the gaps 125 between the fins 118 via the openings 94 and 96, while the air drawn from the exterior of the cabinet circulates through the channels 104 (and through the gaps between the fins 116) via the vents 92 and 97. These two flow paths are isolated from each other, but are thermally connected via the longitudinal side walls 110 and fins 118 of the heat exchanger sections. Further details concerning the modular heat exchanger construction of FIG. 10 can be found in the aforementioned co-pending application of Paul A. Howard and James H. Durham, which is incorporated herein by reference.

Figure 11:
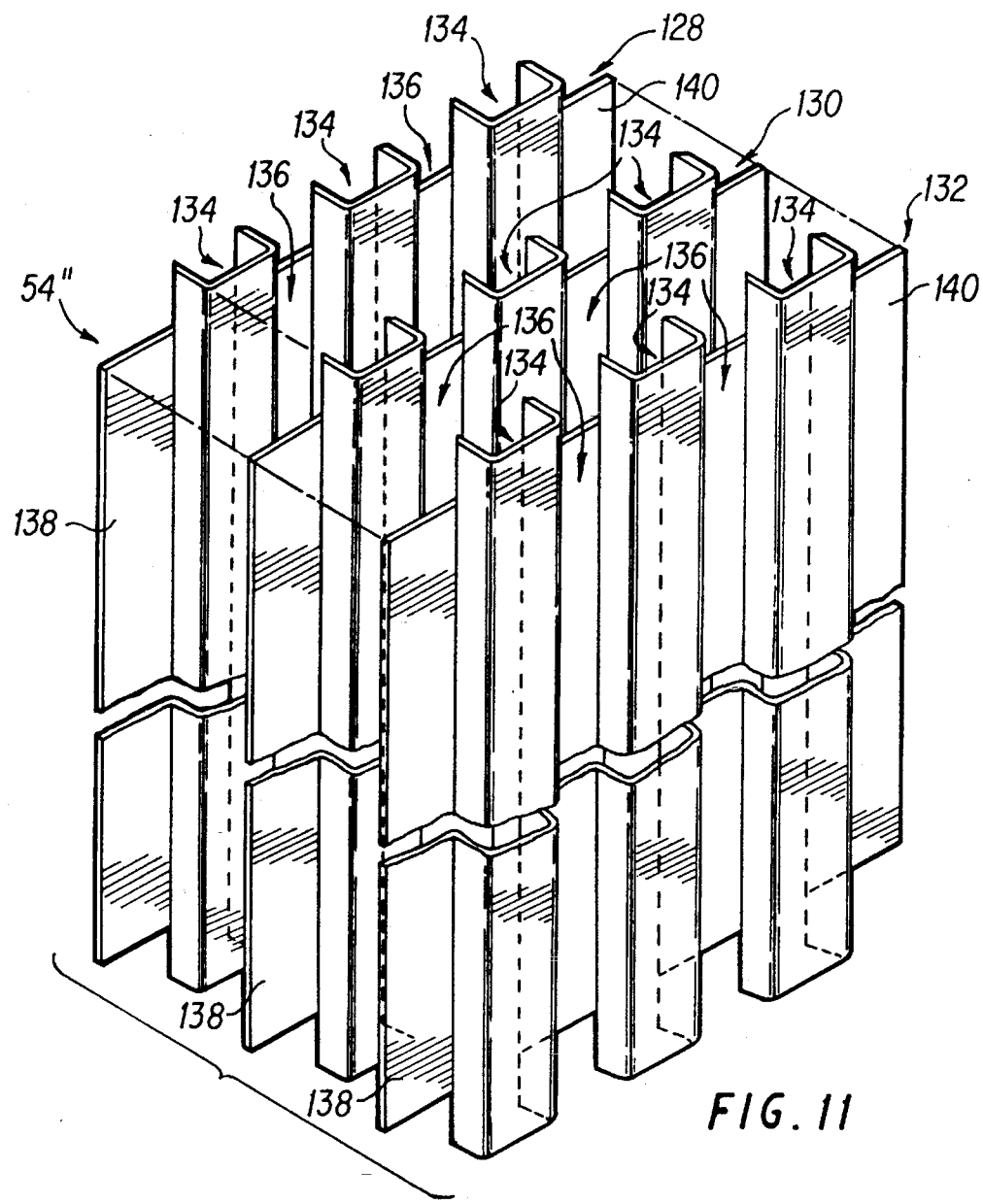
FIGS. 11 and 12 are exploded views of a third type of air-to-air heat exchanger which may be used in connection with the present invention.
Figure 13:
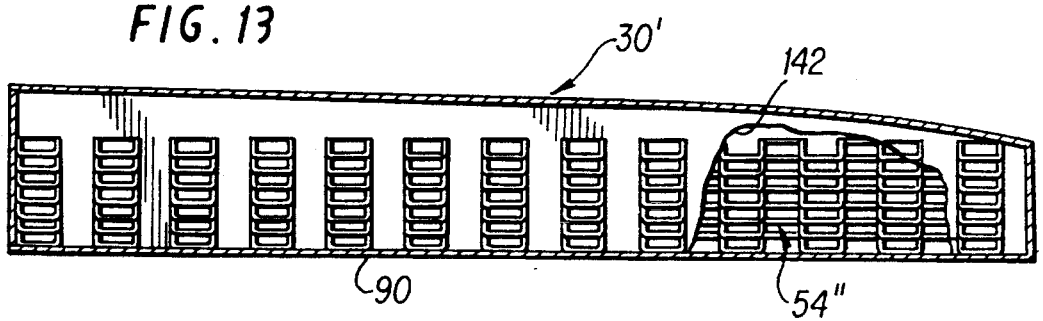
FIG. 13 is a top sectional view illustrating the manner in which the heat exchanger of FIGS. 11 and 12 may be installed in the door of an electrical equipment cabinet.
Figure 12:
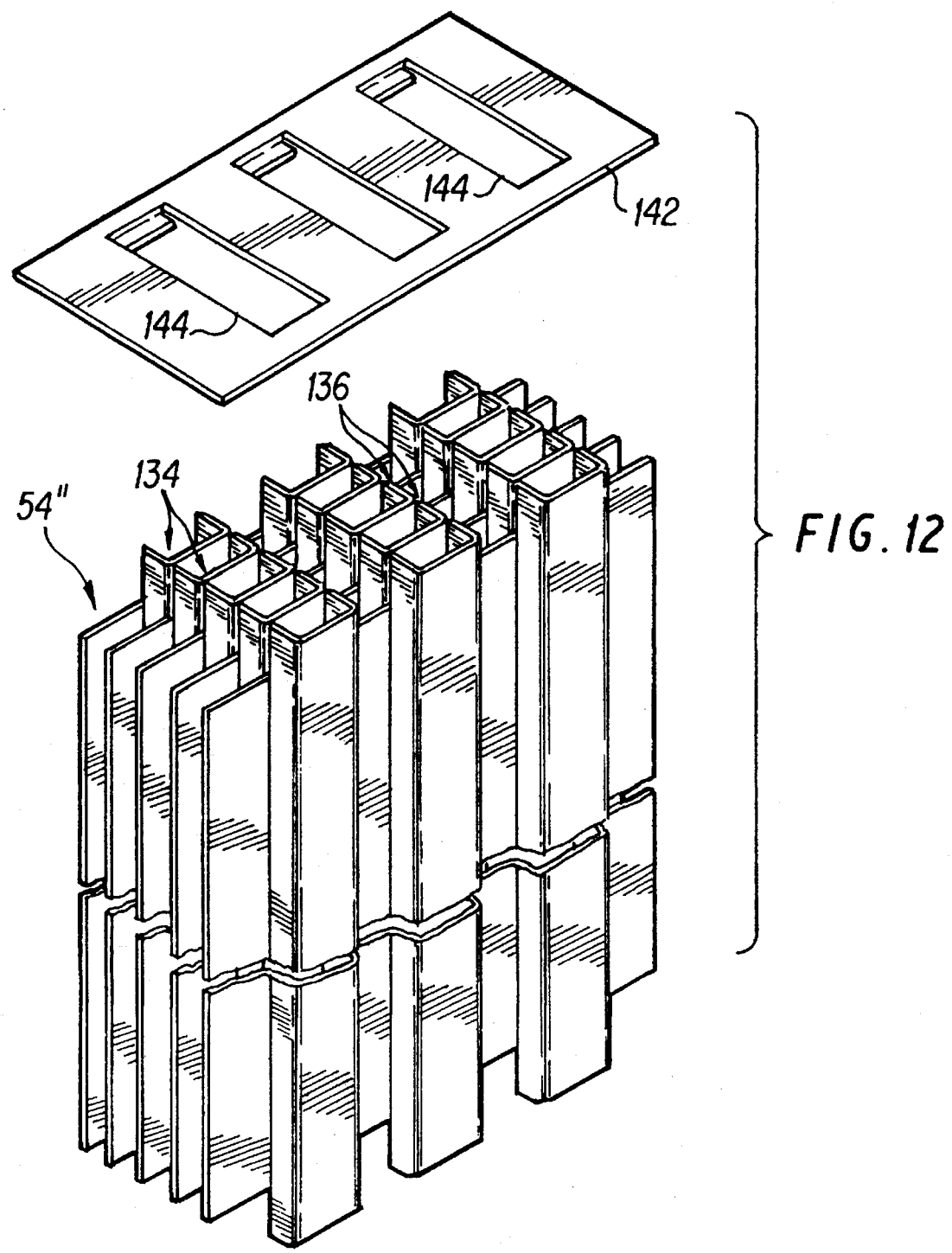

FIGS. 11–13 illustrate a third embodiment of a heat exchanger 54" which may be employed in connection with the present invention. Referring first to FIG. 11, the modified heat exchanger 54" is similar to the previous embodiment in that it can be assembled by stacking a number of substantially identical sections 128, 130 and 132. In the present embodiment, however, the individual sections are shaped to define adjacent, open rectangular channels 134 and 136 which alternate along the width of the heat exchanger section. Each section is also formed with fins 138 and 140 which extend outwardly from the outermost channels 134. In the assembled condition of the heat exchanger 54", shown in FIG. 12 (with a greater number of sections), the open channels 134 and 136 of the heat exchanger sections are closed off longitudinally by the walls of the adjacent section to form closed conduits which are open only at the top and bottom. As shown in FIGS. 11 and 12, the longitudinal walls which define the channels 134 extend vertically above and below the walls which define the channels 136. This makes it possible to isolate the air flow in the channels 134 from the air flow in the channels 136 by using a horizontal partition or baffle plate 142. The baffle plate 142, shown in FIG. 12, is formed with rectangular apertures 144 which are dimensioned to fit tightly around the upwardly projecting portions of the channels 134. A similar baffle plate (not shown) is employed at the bottom of the heat exchanger 54". The upper baffle plate 142 is positioned approximately halfway between the upper outlets of the channels 134 and 136, so that the region above the top of the baffle plate 142 communicates only with the channels 134 and the region below the baffle plate 142 communicates only with the channels 136. The heat exchanger 54" is installed in the door 30' in the manner illustrated in FIG. 13, with the heat exchanger sections 128, 130 and 132 extending parallel to the plane of the door. The door 30' of FIG. 13 has substantially the same arrangement of vent openings as the door 30' described previously in connection with FIGS. 7– 9. The baffle plate 142 is placed at the same vertical location as the baffle plate 124 in FIG. 9, and extends completely across the width and depth of the door 30'. In this way, the exterior or ambient air entering the opening 92 in FIG. 9 flows through the channels 134, and the interior air drawn through the opening 94 flows through the channels 136. The baffle plate at the bottom of the heat exchanger 54" operates in a similar manner to isolate the air flows passing through the openings 96 and 97. The heat exchanger sections of FIGS. 11 and 12 may be affixed to each other by welding, brazing or any other suitable method, and an intermediate sealing plate (not shown) may be placed between adjacent sections to prevent air leakage. The heat exchanger 54" of FIGS. 11–13 is somewhat more difficult to manufacture than the heat exchanger 54' of FIGS. 7–9, but it provides a greater heat transfer area per unit volume and hence operates more efficiently. Additional details of the heat exchanger 54" of FIGS. 11–13, including the sealing plate referred to above, may be found in the aforementioned copending application of Paul A. Howard and James H. Durham.

The advantages of the present invention will be readily apparent from the foregoing description. By virtue of its placement on or within the door of the electrical cabinet, the heat exchanger 54, 54' or 54" occupies space that is normally not used and hence does not significantly reduce the space available within the cabinet for the electrical equipment racks 32 or their interconnecting cables. Although the fan shelves 34 occupy a certain amount of space above the racks 32, this space is not substantially greater than the amount of space occupied by conventional cooling fans in the absence of an air-to-air heat exchanger. Placement of the fans 78 and 80 in the main portion of the cabinet 20, rather than on or within the door structure, is advantageous since it avoids the need to run electrical lines to the door. This arrangement also protects the fans themselves from damage arising from repeated opening and closing of the doors, or from external impacts to the doors. The mounting of the heat exchanger on or within the door also adds strength and integrity to the door structure, and affords greater protection for the electrical equipment racks 32 against external impacts. In the event that the door is struck by a heavy object, the heat exchanger serves as a protective, impact-absorbing structure. Even if a portion of the heat exchanger 54 is crushed by the impact, this merely reduces the air flow through the heat exchanger but does not necessarily render it inoperative.

A further advantage of the door-mounted heat exchanger is that solar loading on the door is reduced, due to the flow of outside air that is maintained along the inside surface of the door by the heat exchanger. This reduces the need for cooling within the interior of the cabinet. In a similar fashion, the heat exchanger 54, 54' or 54" can act as an insulating layer when the fans 78 and 80 are not operating, allowing the cabinet 20 to operate in cold climates with reduced heat loss through the doors and possibly eliminating the need for supplemental heating. From the standpoint of maintenance and repair, placement of the heat exchanger on or within the door structure is advantageous in that the heat exchanger is readily accessible when the door is in the open position, as will be evident from FIG. 1. Cleaning of the heat exchanger can be achieved simply by flushing the vents 38 and 40 with water, which will then simply drain out of the heat exchanger through the corresponding bottom vents 52 and 70. This does not jeopardize any electrical equipment, since there are no electrical lines in the door and the equipment racks 32 inside the cabinet 20 are relatively far from the heat exchanger when the door 30 is in the open position.

Another advantage of the present invention is that the air flow system operates quietly, since the fans 78 and 80 are recessed within the interior of the cabinet 20 and the acoustic paths to the upper and lower vents 46 and 48 are relatively long. With the upper vents 46 serving as an air inlet rather than an air outlet, as in the disclosed embodiment, the incoming air is somewhat cleaner and more free of dust than it would be if drawn from an intake closer to the ground. It will also be appreciated that the continuous flow of air through the roof vents 46 and plenum chamber 84 reduces solar loading on the roof 26, thereby reducing the need for cooling within the interior of the cabinet 20.

While only three exemplary embodiments have been chosen to illustrate the present invention, it will be understood by those skilled in the art that various changes and modifications can be made therein without departing from the spirit and scope of the invention as defined the appended claims. For example, it will be apparent that heat exchangers other than the specific types shown may be used, and that the arrangement of fans and ducts in the electrical cabinet may be changed if desired. Moreover, the present invention may be adapted for use with cabinets having more or fewer doors, and heat exchangers may be mounted to some but not all of the doors if a large cooling capacity is not required. If desired, the heat exchangers may be surface-mounted on the inside or outside of the doors, rather than being housing internally within the door structure. Also, flexible ducts may be provided between the door-mounted heat exchanger and the fans and ducts within the main portion of the cabinet, in place of the gasketed openings described previously.

What is claimed is:

1. An electrical equipment cabinet comprising:
   an enclosure adapted to contain heat-generating electrical equipment, said enclosure having at least one access opening;
   a door providing a closure for said opening, said door when open permitting access to said electrical equipment and when closed maintaining a substantially closed environment in the interior of said cabinet;
   an air-to-air heat exchanger carried by said door for removing heat from the interior of said cabinet while maintaining said substantially closed environment within said cabinet, said heat exchanger defining a first air flow path for air drawn from the exterior of said cabinet and a second air flow path for air drawn from the interior of said cabinet, said first and second air flow paths being substantially isolated from each other; and
   a powered fan mounted in said enclosure for circulating air through at least one of said first and second air flow paths.

2. An electrical equipment cabinet as claimed in claim 1, wherein said powered fan circulates air through said first air flow path, and further comprising:
   an external air vent in said cabinet; and
   a third air flow path within said enclosure for connecting said first air flow path and said external air vent, said third air flow path being substantially isolated from said second air flow path and from the air in the interior of said cabinet.

3. An electrical equipment cabinet as claimed in claim 2, wherein said powered fan is mounted in said third air flow path in order to maintain a flow of air through said first and third air flow paths.

4. An electrical equipment cabinet as claimed in claim 2, wherein:
   said first air flow path defined by said heat exchanger terminates at one end in a first opening;
   said third air flow path within said enclosure terminates in a second opening at an end opposite to said external air vent; and
   said first and second openings are positioned in confronting relationship to each other when said door is closed in order to connect said first and third air flow paths, said first and second openings being separated from each other when said door is opened in order to disconnect said first and third air flow paths.

5. An electrical equipment cabinet as claimed in claim 4, further comprising sealing means carried by at least one of said first and second openings to seal the connection between said first and third air flow paths when said door is closed.

6. An electrical equipment cabinet as claimed in claim 5, wherein said sealing means comprises a resilient gasket.

7. An electrical equipment cabinet as claimed in claim 2, wherein said cabinet has sides and a top, and wherein said external air vent is located at or near the top of said cabinet.

8. An electrical equipment cabinet as claimed in claim 7, wherein said first air flow path defined by said heat exchanger terminates at one end in an opening communicating with the exterior of said cabinet, said opening being located at or near the bottom of said cabinet.

9. An electrical equipment cabinet as claimed in claim 8, wherein said powered fan circulates air through said first air flow path in a direction from said external air vent to said opening.

10. An electrical equipment cabinet as claimed in claim 1, wherein said powered fan circulates air through said second air flow path.

11. An electrical equipment cabinet as claimed in claim 10, further comprising a third air flow path within said enclosure for connecting said second air flow path and the interior of said cabinet.

12. An electrical equipment cabinet as claimed in claim 11, wherein said powered fan is mounted in said third air flow path in order to maintain a flow of air through said second and third air flow paths.

13. An electrical equipment cabinet as claimed in claim 11, wherein:
   said second air flow path defined by said heat exchanger terminates at one end in a first opening;
   said third air flow path within said enclosure terminates at one end in a second opening; and
   said first and second openings are positioned in confronting relationship to each other when said door is closed in order to connect said second and third air flow paths, said first and second openings being separated from each other when said door is opened in order to disconnect said second and third air flow paths.

14. An electrical equipment cabinet as claimed in claim 13, further comprising sealing means carried by at least one of said first and second openings to seal the connection between said second and third air flow paths when said door is closed.

15. An electrical equipment cabinet as claimed in claim 14, wherein said sealing means comprises a resilient gasket.

16. An electrical equipment cabinet comprising:
   an enclosure adapted to contain heat-generating electrical equipment, said enclosure having at least one access opening;
   a door providing a closure for said opening, said door when open permitting access to said electrical equipment and when closed maintaining a substantially closed environment in the interior of said cabinet;
   an air-to-air heat exchanger carried by said door for removing heat from the interior of said cabinet while maintaining said substantially closed environment within said cabinet, said heat exchanger defining a first air flow path for air drawn from the exterior of said cabinet and a second air flow path for air drawn from the interior of said cabinet, said first and second air flow paths being substantially isolated from each other;
   a first powered fan mounted in said enclosure for circulating air through said first air flow path; and
   a second powered fan mounted in said enclosure for circulating air through said second air flow path.

17. An electrical equipment cabinet as claimed in claim 16, further comprising:
   an external air vent in said cabinet;
   a third air flow path within said enclosure for connecting said first air flow path and said external air vent, said third air flow path being substantially isolated from said second air flow path and from the air in the interior of said cabinet;
   a fourth air flow path within said enclosure for connecting said second air flow path and the interior of said cabinet.

18. An electrical equipment cabinet as claimed in claim 17, wherein said first powered fan is mounted in said third air flow path and said second powered fan is mounted in said fourth air flow path, said third and fourth air flow paths comprising at least in part a common duct structure which is removable as a unit from said enclosure.

19. An electrical equipment cabinet as claimed in claim 17, wherein:
   said first air flow path defined by said heat exchanger terminates at one end in a first opening;
   said third air flow path within said enclosure terminates in a second opening at an end opposite to said external air vent;
   said second air flow path defined by said heat exchanger terminates at one end in a third opening;
   said fourth air flow path within said enclosure terminates in a fourth opening at an end opposite to an end communicating with the interior of said cabinet; and
   said first and second openings and said third and fourth openings, respectively, are positioned in confronting relationship to each other when said door is closed in order to connect said first and third air flow paths and said second and fourth air flow paths, respectively, said first and second openings and said third and fourth openings being separated from each other when said door is opened in order to disconnect said first and third air flow paths and said second and fourth air flow paths, respectively.

20. An electrical equipment cabinet as claimed in claim 19, further comprising sealing means carried by at least one of said first and second openings and by at least one of said third and fourth openings to seal the connection between said first and second openings and between said third and fourth openings, respectively.

21. An electrical equipment cabinet as claimed in claim 20, wherein said sealing means comprises a resilient gasket.

22. An electrical equipment cabinet as claimed in claim 21, wherein said cabinet has sides and a top, and wherein said external air vent is located at or near the top of said cabinet.

23. An electrical equipment cabinet as claimed in claim 22, wherein said first air flow path defined by said heat exchanger terminates at one end in a fifth opening communicating with the exterior of said cabinet, said fifth opening being located at or near the bottom of said cabinet.

24. An electrical equipment cabinet as claimed in claim 23, wherein said first powered fan circulates air through said first air flow path in a direction from said external air vent to said fifth opening.

25. An electrical equipment cabinet as claimed in claim 16, wherein said first and second air flow paths defined by said heat exchanger are substantially parallel, and wherein said first and second powered fans maintain oppositely directed air flows in said first and second air flow paths.

26. A method for using an air-to-air heat exchanger to provide cooling to the interior of an electrical equipment cabinet having an enclosure portion with an access opening and a door providing a closure for said access opening, comprising the steps of:
   mounting said heat exchanger to the door of said electrical equipment cabinet;
   maintaining a first flow of air drawn from the exterior of said cabinet through a first air flow path in said heat exchanger; and
   maintaining a second flow of air drawn from the interior of said cabinet through a second air flow path in said heat exchanger, said first and second air flow paths being substantially isolated from each other;
   wherein at least one of said first and second air flows is maintained by powered air flow means mounted in the enclosure portion of said cabinet.

27. The method of claim 26, further comprising the steps of:
   completing a third air flow paths between said first air flow path and the exterior of said cabinet by maintaining said door in a closed position, said third air flow path passing through the enclosure portion of said cabinet and being substantially isolated from said second air flow path and from the air in the interior of said cabinet; and breaking said third air flow path by moving said door to an open position.

28. The method of claim 26, further comprising the steps of:

completing a third air flow path between said second air flow path and the interior of said cabinet by maintaining said door in a closed position; and breaking said third air flow path by moving said door to an open position.

29. The method of claim 26, further comprising the steps of:

completing a third air flow path between said first air flow path and the exterior of said cabinet by maintaining said door in a closed position, said third air flow path passing through the enclosure portion of said cabinet and being substantially isolated from said second air flow path and from the air in the interior of said cabinet;

completing a fourth air flow path between said second air flow path and the interior of said cabinet by maintaining said door in a closed position; and breaking said third and fourth air flow paths by moving said door to an open position.

* * * * *